(12) United States Patent
Persaud et al.

(10) Patent No.: US 11,984,844 B2
(45) Date of Patent: May 14, 2024

(54) WINDOW-MOUNTED INTERIOR SOLAR PANEL

(71) Applicant: Grouphug, Inc., Brooklyn, NY (US)

(72) Inventors: Krystal Persaud, New York, NY (US); Geof Lipman, New York, NY (US)

(73) Assignee: Grouphug, Inc., Brooklyn, NY (US)

( * ) Notice: Subject to any disclaimer, the term of this patent is extended or adjusted under 35 U.S.C. 154(b) by 0 days.

(21) Appl. No.: 17/539,930

(22) Filed: Dec. 1, 2021

(65) Prior Publication Data

US 2022/0094300 A1 Mar. 24, 2022

Related U.S. Application Data

(63) Continuation of application No. PCT/US2020/036337, filed on Jun. 5, 2020.

(60) Provisional application No. 62/858,046, filed on Jun. 6, 2019.

(51) Int. Cl.
*H02S 10/40* (2014.01)
*H01L 31/048* (2014.01)
*H02S 30/10* (2014.01)
*H02S 40/38* (2014.01)

(52) U.S. Cl.
CPC .......... *H02S 30/10* (2014.12); *H01L 31/0488* (2013.01); *H02S 10/40* (2014.12); *H02S 40/38* (2014.12)

(58) Field of Classification Search
CPC ....... H01L 31/00–078; H02S 20/00–32; H02S 30/00–20; H02S 40/00–44
See application file for complete search history.

(56) References Cited

U.S. PATENT DOCUMENTS

| | | | |
|---|---|---|---|
| 6,094,306 A | 7/2000 | Jain | |
| 9,490,659 B1* | 11/2016 | English | H02J 7/35 |
| 9,837,568 B1* | 12/2017 | Frimpong | H02S 20/30 |
| 2003/0098056 A1 | 5/2003 | Fronek et al. | |
| 2007/0108333 A1 | 5/2007 | Kuramoto | |
| 2007/0251566 A1* | 11/2007 | Ouchida | H01L 31/0468 |
| | | | 257/E31.097 |
| 2013/0305528 A1* | 11/2013 | Anderson | H02J 7/00 |
| | | | 29/825 |
| 2013/0329404 A1* | 12/2013 | Larkin | F21S 9/037 |
| | | | 362/183 |
| 2018/0274806 A1 | 9/2018 | Arndt | |

(Continued)

FOREIGN PATENT DOCUMENTS

| | | | |
|---|---|---|---|
| CN | 205189710 U | * | 4/2016 |
| CN | 208369508 | * | 1/2019 |
| KR | 20170019115 A | * | 2/2017 |

OTHER PUBLICATIONS

CN208369508 English translation (Year: 2019).*

(Continued)

*Primary Examiner* — Bach T Dinh
(74) *Attorney, Agent, or Firm* — Myers Wolin, LLC

(57) ABSTRACT

A solar assembly is provided comprising a frame, a transparent panel mounted within the frame, with the frame forming a boundary about the transparent panel, and at least one solar cell mounted on the transparent panel. At least a portion of the transparent panel forms a boundary between the frame and the solar cell. As such, a visual clear glass boundary may be formed between the solar cell and the frame of the assembly.

12 Claims, 16 Drawing Sheets

(56) References Cited

U.S. PATENT DOCUMENTS

2020/0006585 A1\* 1/2020 Meuris ............... H01L 31/0445
2020/0328319 A1\* 10/2020 Mellor ................ H01L 31/048

OTHER PUBLICATIONS

KR20120008715 Original and English translation (Year: 2012).\*
CN-205189710-U English translation (Year: 2016).\*
KR-20170019115-A English translation (Year: 2017).\*
International Search Report issued for corresponding International Application No. PCT/US20/36337 dated Sep. 2, 2020.
Grouphug Solar, "Grouphug Solar—Photos—Facebook," URL: https://www.facebook.com/pg/grouphugsolar/photos/, posts dated May 17, 2019; May 28, 2019; Feb. 12, 2019; Jan. 28, 2019, pp. 1-273, entire document accessed from the internet on Jul. 23, 2020.
Clearbags, "Crystal Clear Photo Mounts," URL: https://www.clearbags.com/mats-backing/mounting/photo, pp. 1-4, accessed from the internet on Jul. 23, 2020.

\* cited by examiner

WINDOW-MOUNTED INTERIOR SOLAR PANEL

CROSS-REFERENCE TO RELATED APPLICATION

This application is a continuation of International Application No. PCT/US2020/036337, filed Jun. 5, 2020, which claims the benefit of U.S. Provisional Patent Application, No. 62/858,046, filed Jun. 6, 2019, the contents of each of which are hereby incorporated by reference in their entirety.

FIELD OF THE INVENTION

The invention is in the field of solar panels, namely solar panel assemblies that attach to the interior of a window.

BACKGROUND

Less than 2% of electricity in the US was generated from solar panels in 2017. The most common way for consumers to adopt solar panels is to install them on the rooftop of a house. This is a huge financial burden for two reasons. First, only 64% of Americans own a home. Installing solar panels on your roof assume you can afford to own a home or building. Second, installation costs are substantial, even after considering potential tax credits. Photovoltaics have advanced in efficiency & dramatically dropped in cost over the last 10 years, yet existing applications of such solar cells remain limited largely to rooftops.

While some portable solar panel assemblies and systems do exist, they are typically purpose built for, for example, camping applications. Accordingly there may be a focus on durability and portability of the assembly at the expense of efficiency or aesthetics.

Solar panels may be installed in place of window panes. However, such installations are expensive and permanent, and require custom installation and construction. Such panels also obstruct use of a window and are not aesthetically pleasing.

Solar assemblies may be provided as application specific devices, such as solar powered blinds or solar powered water pumps. Accordingly, such devices may receive sunlight through a window, but may be limited in what the generated power may be used for.

Further, traditional solar assemblies are not designed to be viewed by end consumers, so solar cells are often not aesthetically pleasing. For example, soldering patterns and solar cell layout is purely utilitarian, resulting in aesthetically unattractive designs.

There is a need for a consumer solar assembly that can be used to generate power and that can be utilized without significant installation requirements. There is a further need that such an assembly be aesthetically pleasing, or that it not interfere with existing aesthetics. There is a further need for such an assembly that can be installed so as to not cause permanent damage to a window or apartment, and such that installation can be performed quickly by a lay person without any special tools or knowledge. There is a further need that such installation not require formal documentation or approval from local jurisdictions.

SUMMARY

Solar panel assemblies are provided which are aesthetically pleasing and easy for consumers to install on their own. In some embodiments, such a solar assembly comprises a frame, a transparent panel mounted within the frame, with the frame forming a boundary about the transparent panel, and at least one solar cell mounted on the transparent panel. In such an embodiment, at least a portion of the transparent panel forms a boundary between the frame and the solar cell. As such, a visual clear glass boundary may be formed between the solar cell and the frame of the assembly.

The solar assembly may further comprise a power storage element located within a cavity in the frame and a wire for transporting power generated from the solar cell to the power storage element.

The solar assembly may further comprise a power port in the frame for accessing power stored in the power storage element. The assembly may further comprise a circuit board for managing the charging of the power storage element and for managing power output at the power port.

The power port may be, for example, a USB port or a power cable for charging a user device. In some embodiments, the solar assembly may further comprise a retractor for retracting the power cable into the cavity.

In some embodiments, the transparent panel is one of a pair of transparent panels, such that the first and second transparent panels sandwich the solar cell. Further, in some embodiments, the wire runs between the transparent panels and is made of a thin material, such that it is not easily visible when the solar assembly is viewed from outside the transparent panel. In some such embodiments, the wire may have a clear insulation coating to prevent it from being visible.

In some embodiments, the one or more transparent panels are formed from glass. In other embodiments, the transparent panels are formed from transparent plastics.

In some embodiments, the solar cell is one of a plurality of solar cells mounted on the transparent panel so as to form a pattern. Such a pattern may be a geometric pattern, or may take the form of an animal or other aesthetically pleasing pattern.

In some embodiments, the solar assembly further comprises an appliance to be powered by the solar assembly, such that the power storage element outputs power to the appliance. Such an appliance may be, for example, an air conditioner.

In some embodiments, the solar assembly further comprises a pocket formed in or provided on the transparent panel, such that a photograph or the like may be inserted within the pocket.

In some embodiments, the transparent panel may further comprise a diffraction grating, such that light that passes through the transparent panel is diffracted.

DETAILED DESCRIPTION OF THE PREFERRED EMBODIMENTS

Figure 1:
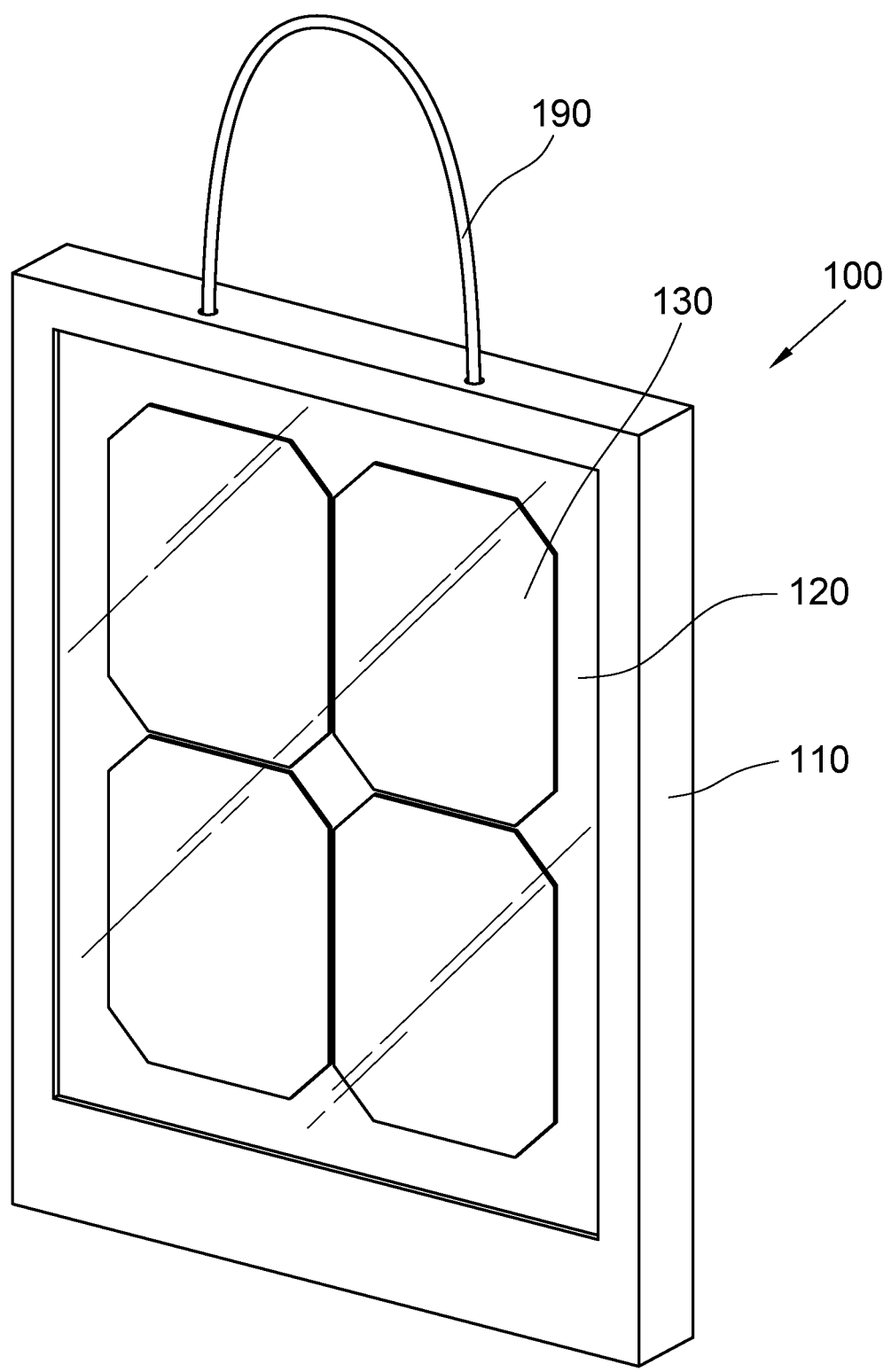
FIG. 1 is a front perspective view of a solar assembly in accordance with this disclosure.

The description of illustrative embodiments according to principles of the present invention is intended to be read in connection with the accompanying drawings, which are to be considered part of the entire written description. In the description of embodiments of the invention disclosed herein, any reference to direction or orientation is merely intended for convenience of description and is not intended in any way to limit the scope of the present invention. Relative terms such as "lower," "upper," "horizontal," "vertical," "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation unless explicitly indicated as such. Terms such as "attached," "affixed," "connected," "coupled," "interconnected," and similar refer to a relationship wherein structures are secured or attached to one another either directly or indirectly through intervening structures, as well as both movable or rigid attachments or relationships, unless expressly described otherwise. Moreover, the features and benefits of the invention are illustrated by reference to the exemplified embodiments. Accordingly, the invention expressly should not be limited to such exemplary embodiments illustrating some possible non-limiting combination of features that may exist alone or in other combinations of features; the scope of the invention being defined by the claims appended hereto.

This disclosure describes the best mode or modes of practicing the invention as presently contemplated. This description is not intended to be understood in a limiting sense, but provides an example of the invention presented solely for illustrative purposes by reference to the accompanying drawings to advise one of ordinary skill in the art of the advantages and construction of the invention. In the various views of the drawings, like reference characters designate like or similar parts.

In an exemplary embodiment, a solar panel assembly is provided that has a frame with a built-in circuit board & battery. When light hits the solar panel, the internal battery charges. A user can then plug a USB compatible device (like a phone or tablet) into the frame and charge off-the-grid. The solar panel can be easily installed & used in any home, apartment, school, or other building.

Figure 2:
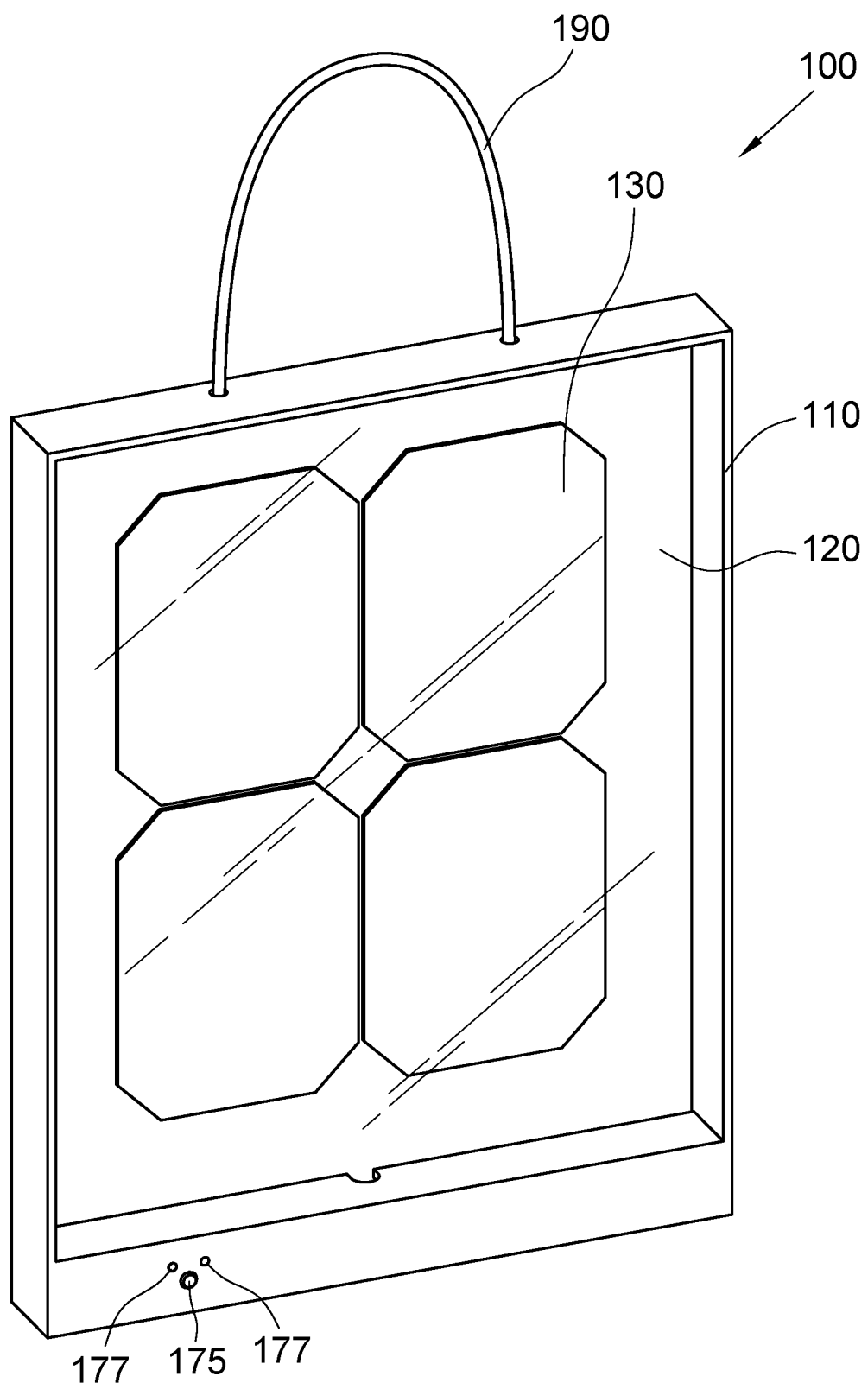
FIG. 2 is a back perspective view of the solar assembly of FIG. 1.
Figure 3:
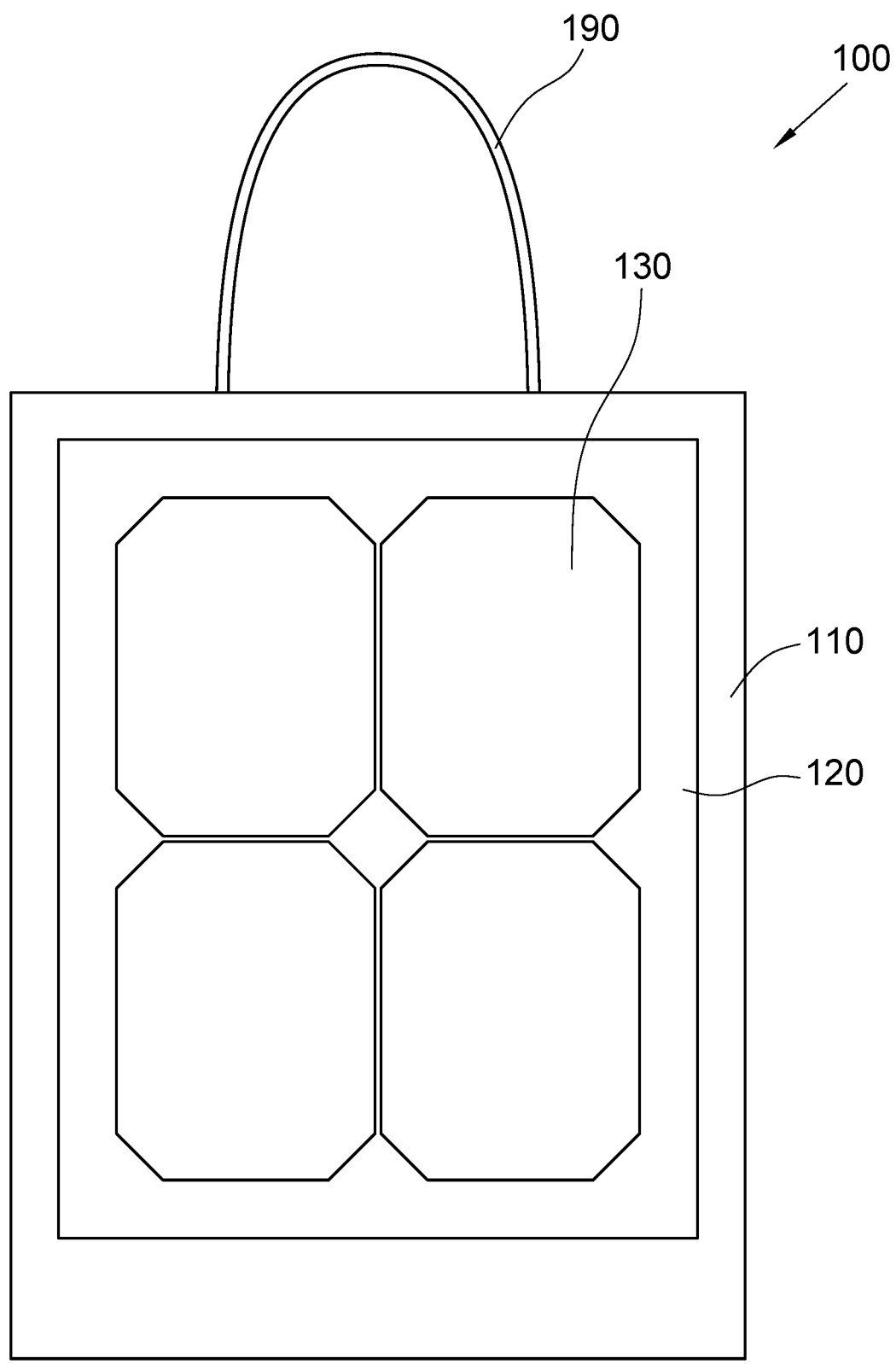
FIGS. 3 and 4 are front and back plan views respectively of the solar assembly of FIG. 1.
Figure 4:
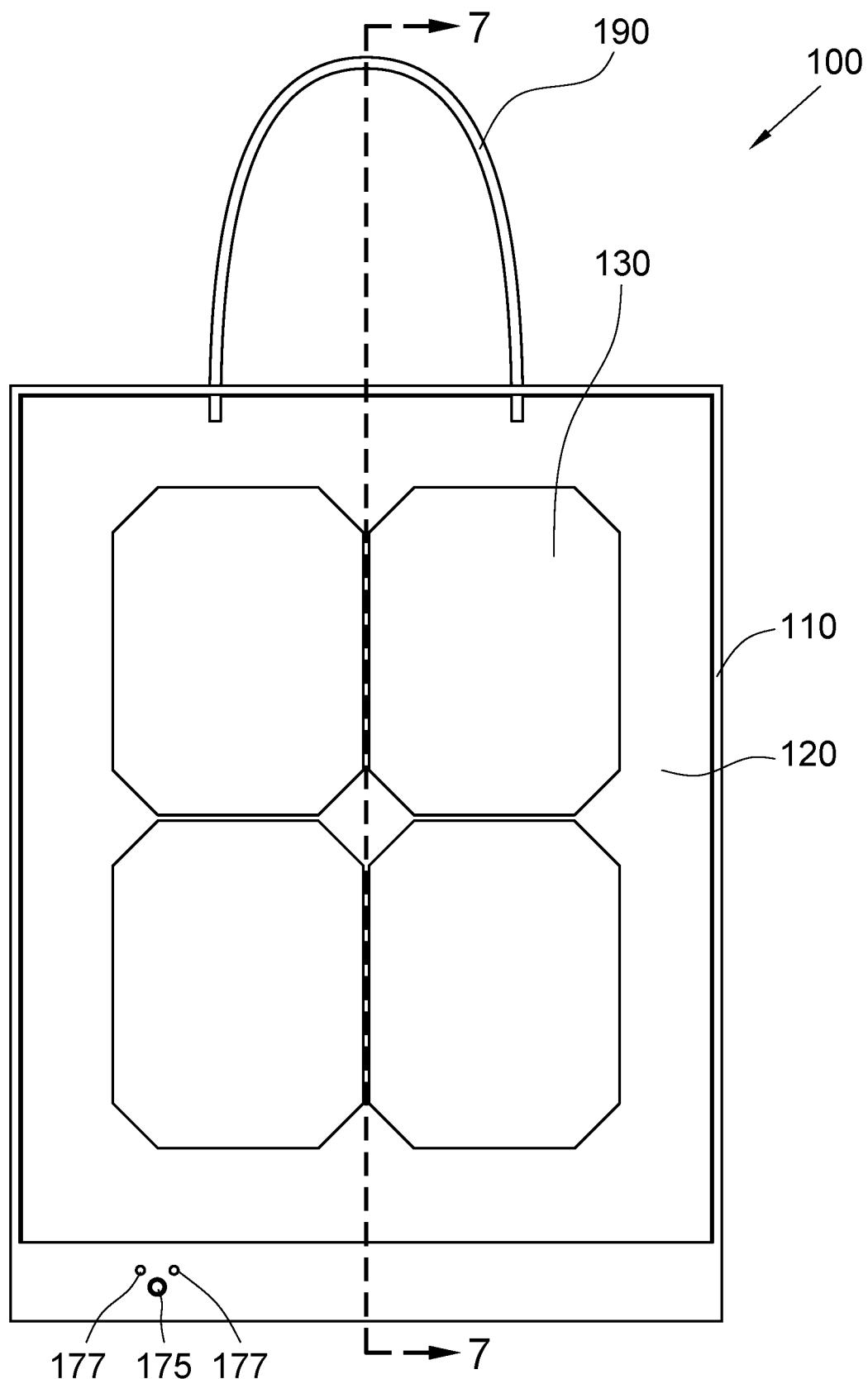
Figure 5:
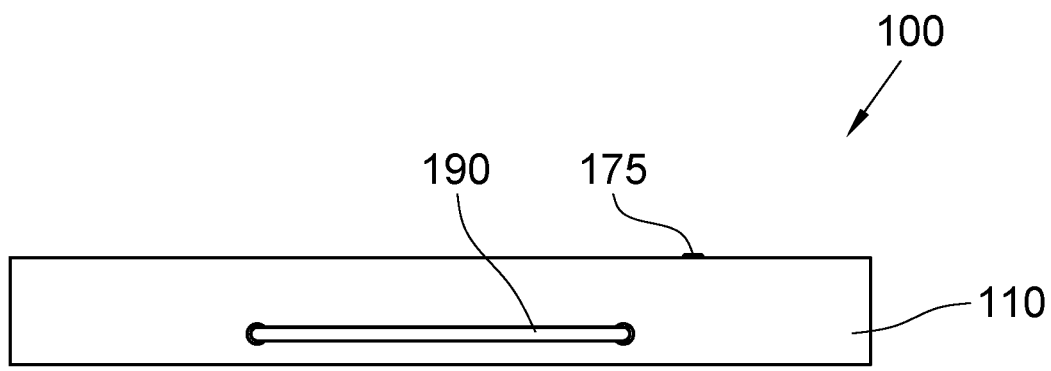
FIG. 5 is a top view of the solar assembly of FIG. 1.
Figure 6:
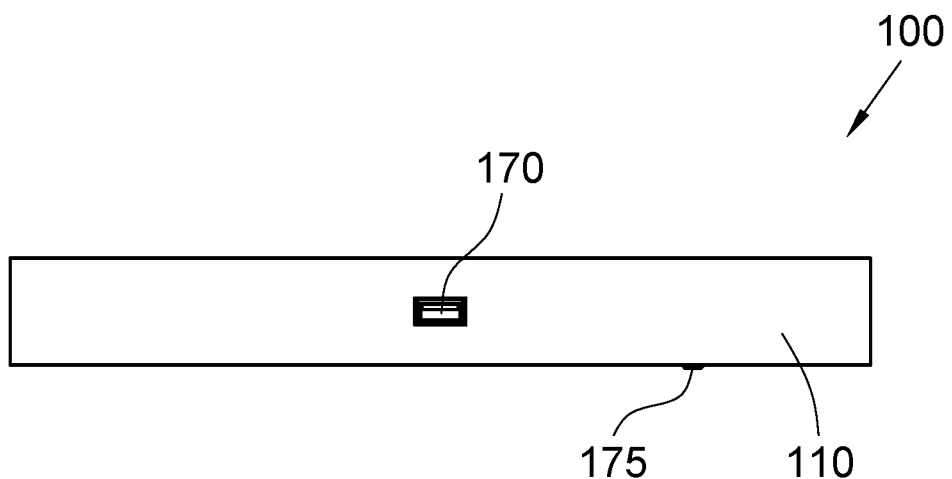
FIG. 6 is a bottom view of the solar assembly of FIG. 1.
Figure 7:
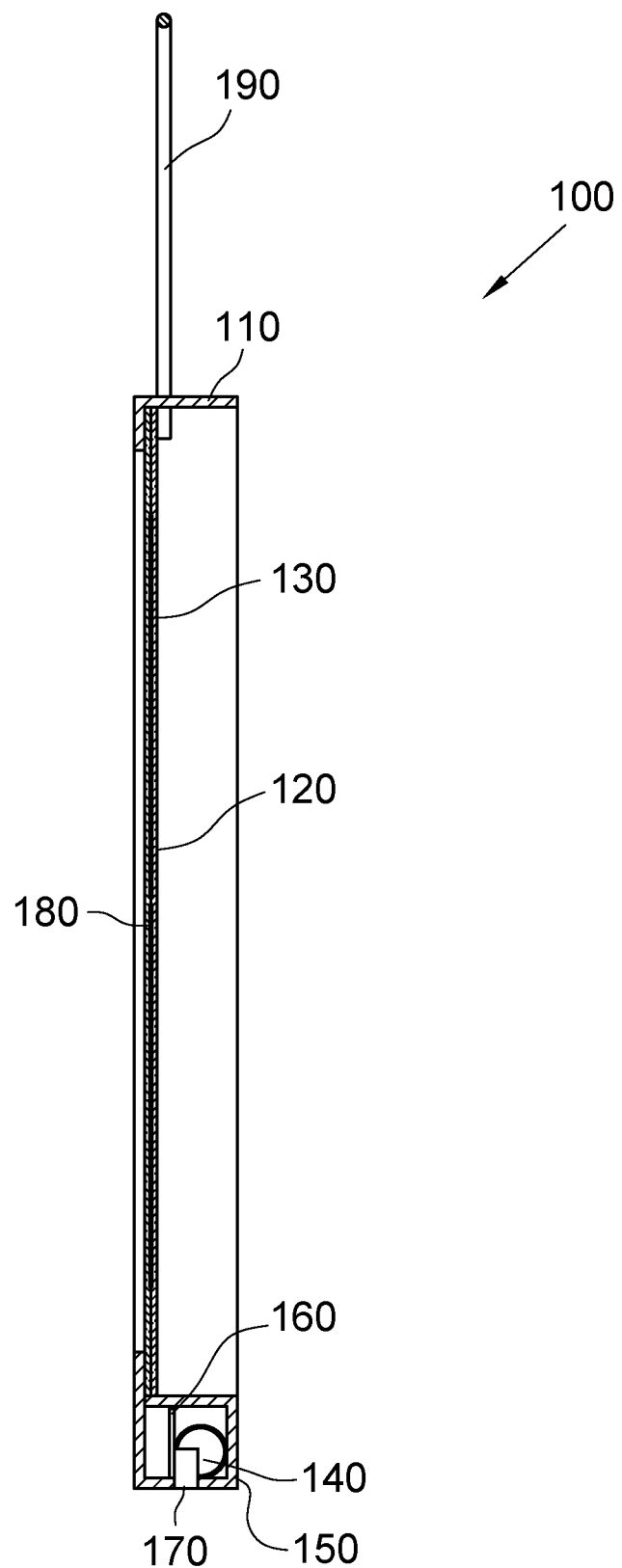
FIG. 7 is a section view of the solar assembly of FIG. 1.

FIG. 1 is a front perspective view of a solar assembly 100 in accordance with this disclosure. FIG. 2 is a back perspective view of the solar assembly 100 of FIG. 1. FIGS. 3 and 4 are front and back plan views respectively of the solar assembly 100. FIG. 5 is a top view of the solar assembly 100 and FIG. 6 is a bottom view of the solar assembly, and FIG. 7 is a section view of the solar assembly. It is noted that when referring to the "front" and "back" of the solar assembly 100, the front is the surface that faces the solar source of energy, such that when the solar assembly 100 is installed, the back side may be facing the inside of a room.

As shown, the solar assembly 100 typically comprises a frame 110, a transparent panel 120 mounted within the frame, with the frame forming a boundary about the transparent panel, and at least one solar cell 130 mounted on the transparent panel. The solar cell 130 is mounted such that a portion of the transparent panel 120 forms a boundary between the frame 110 and the solar cell. Accordingly, a transparent section is provided that fully surrounds the solar cell 130, providing the effect of the solar cell floating within the frame 110.

The solar cell 130 or cells may be provided as monocrystalline solar cells, polycrystalline solar cells, or bifacial solar cells. In some embodiments, the solar cell 130 may be one or more copper indium gallium selenide solar cell.

The solar assembly 100 typically provides a power storage element 140, such as a battery, and the power storage element may be located within a cavity 150 in the frame 110. The cavity may further contain a circuit board 160, typically in the form of a one or two sided printed circuit board (PCB), and other components required to operate the solar assembly 110. The solar assembly 100 also typically provides a power port 170 for accessing power stored in the power storage element 140. Such a power port may be a USB port, as shown. The circuit board 160 typically manages the charging of the power storage element 140, as well as the power output of any power at the power port 170.

The segment of the frame 110 containing the cavity 150 may be very thin, such that the frame can contain a cavity large enough to account for a traditional battery. Further, a custom PCB may be manufactured using low profile techniques in order to provide a board that can fit inside the cavity 150. Such a PCB may be, for example, USB mounted.

In some embodiments, the power storage element 140 may be removable or swappable. In some embodiments, the power storage element 140 may be a battery that is removable from the frame and usable on the go. Any standard battery type may be used, including, for example, lithium ion batteries.

A button 175 may be provided for controlling the solar assembly 100, or for turning it on and off, and one or more LEDs 177 may be provided for indicating status of the assembly 100. For example, the LEDs 177 may light up or flash a first pattern or color to indicate that a power storage element 140 is charging and a second pattern or color to indicate that the element is fully charged.

While the power port 170 is shown as a USB port, this is only one example of potential power ports. In some embodiments, the power port 170 may be a power cable for charging a user device. In such an embodiment, the solar assembly 100 may include a retracting mechanism for retracting the power cord into the frame 110 of the solar assembly 100. In other embodiments, a storage compartment may be included in the frame for storage of charging cables. In some embodiments, the power port 170 may be an AC outlet or a USB-C port.

Figure 12:
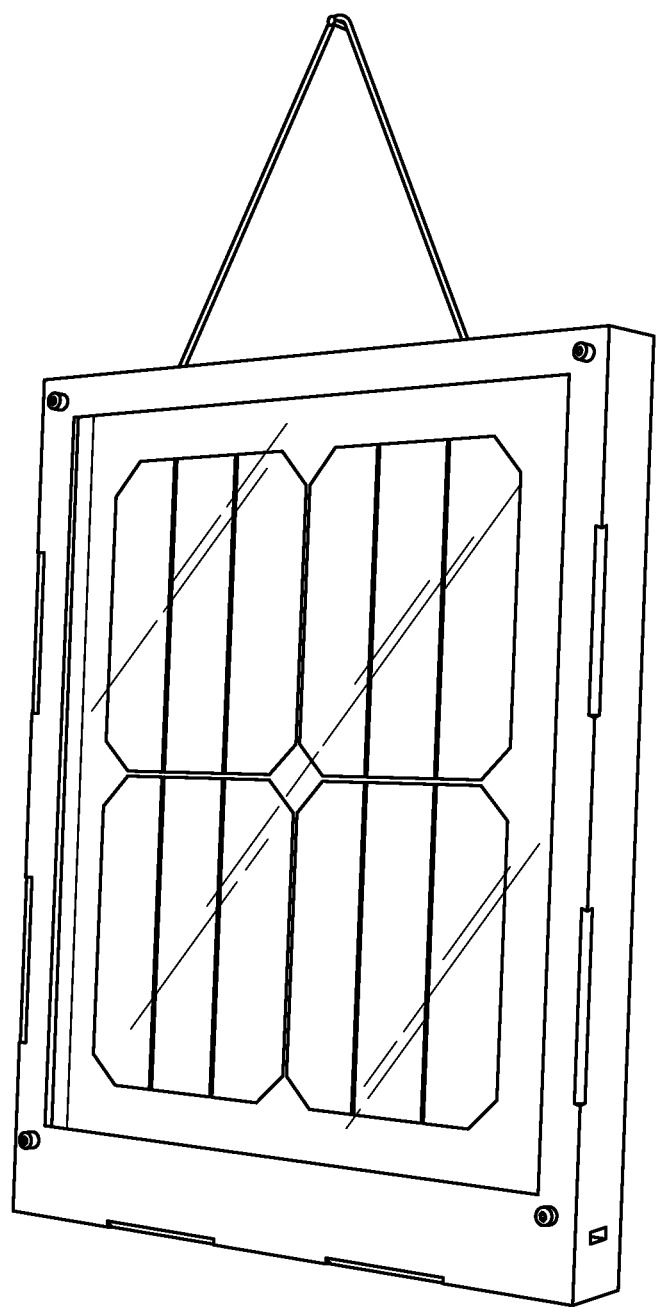
FIG. 12 is a front perspective view of a fifth embodiment of a solar assembly in accordance with this disclosure.

A wire, shown, for example, in FIG. 12, is then provided for transporting power generated from the solar cell 130 to the power storage element 140.

In some embodiments, a single solar cell 130 is provided, and it may be mounted centrally within the frame 110 on the transparent panel 120. In other embodiments, several solar cells 130 may be provided, as shown, and they may form an aesthetically pleasing pattern, apparently suspended within the frame 110. In such embodiments, the pattern may comprise solar cells 130 immediately adjacent each other, or with some spacing between them, such that light passes through the assembly 100 in between the individual solar cells. Where multiple solar cells 130 are utilized, they may be arranged as a standard grid or in a decorative way, such as the herringbone pattern shown in FIGS. 8 and 9.

While some embodiments may provide a single transparent panel 120, such as that discussed above, typical embodiments provide a first transparent panel 120 and a second transparent panel 180 for sandwiching the solar cell 130, thereby protecting it from the elements. In such embodiments, the transparent panels 120, 180 may further protect the solar cell 130 and the wire. The wire may thereby be thinner, or uninsulated, so as to allow the wire to be invisible when viewed from outside the transparent panels 120, 180. The transparent panels 120, 180, are typically glass or plastic, but other transparent materials are contemplated as well.

In some embodiments, one or more of the transparent panels 120, 180 may further comprise a diffraction grating for diffracting light. In such embodiments, the diffraction grating may be part of the transparent panel 120, 180, or it may be an additional film to be applied to a surface. Such an embodiment is described in more detail below with respect to FIGS. 15 and 16.

As shown, the sandwich, formed from the transparent panels 120, 180 may incorporate resin in order to suspend the solar cells 130 between the panels. In such an embodiment, the first transparent panel 120 may be glass or plastic, and may be coated with a resin, and the second transparent panel 180 may be similarly coated with a resin, with the solar cells 130 suspended in between. Accordingly, there may be no space between the panels, and the resin may flow around the solar cells 130. Further, the resin may insulate the wire, such that no insulation is necessary.

In alternative embodiments, the solar cells may be located between glass sheets, in which case a space may be visible between the glass sheets in locations where no solar cells are present. This is shown, for example, in FIG. 17.

Further, while both materials are contemplated as transparent, in some embodiments, a second panel that is not transparent, or that is otherwise distinguished from the first panel, may be provided. For example, the second panel may comprise colored plastic or glass, or it may comprise metal, such as aluminum or stainless steel.

In some embodiments, the transparent panel 120, 180 covering the back of the assembly may further comprise a pocket for inserting an object to display, such as a photograph. Accordingly, when viewed from the back of the solar assembly 100, such as from inside a room in which the solar assembly is installed, the assembly may have the appearance of a picture frame. Alternatively, a pocket or cut out may be provided for supporting decorative inserts.

The frame 110 may comprise a wide variety of materials, including, for example, bamboo, wood, metal, or plastic. Such materials may be selected for insulative or aesthetic benefits.

A cable 190 may be provided for hanging the solar assembly 100. In some embodiments, one or more suction cups may be provided as well. Such suction cups may be provided for hanging the cable 190, or may be provided on the frame itself 110, allowing the frame to be directly mounted on a window. Other fixation assemblies for semi-permanently installing the solar assembly 100 may include a suction cup with a hook, transparent hook and loop material or 3M dual lock, micro suction tape, or semi-permanent transparent adhesives.

Figure 8:
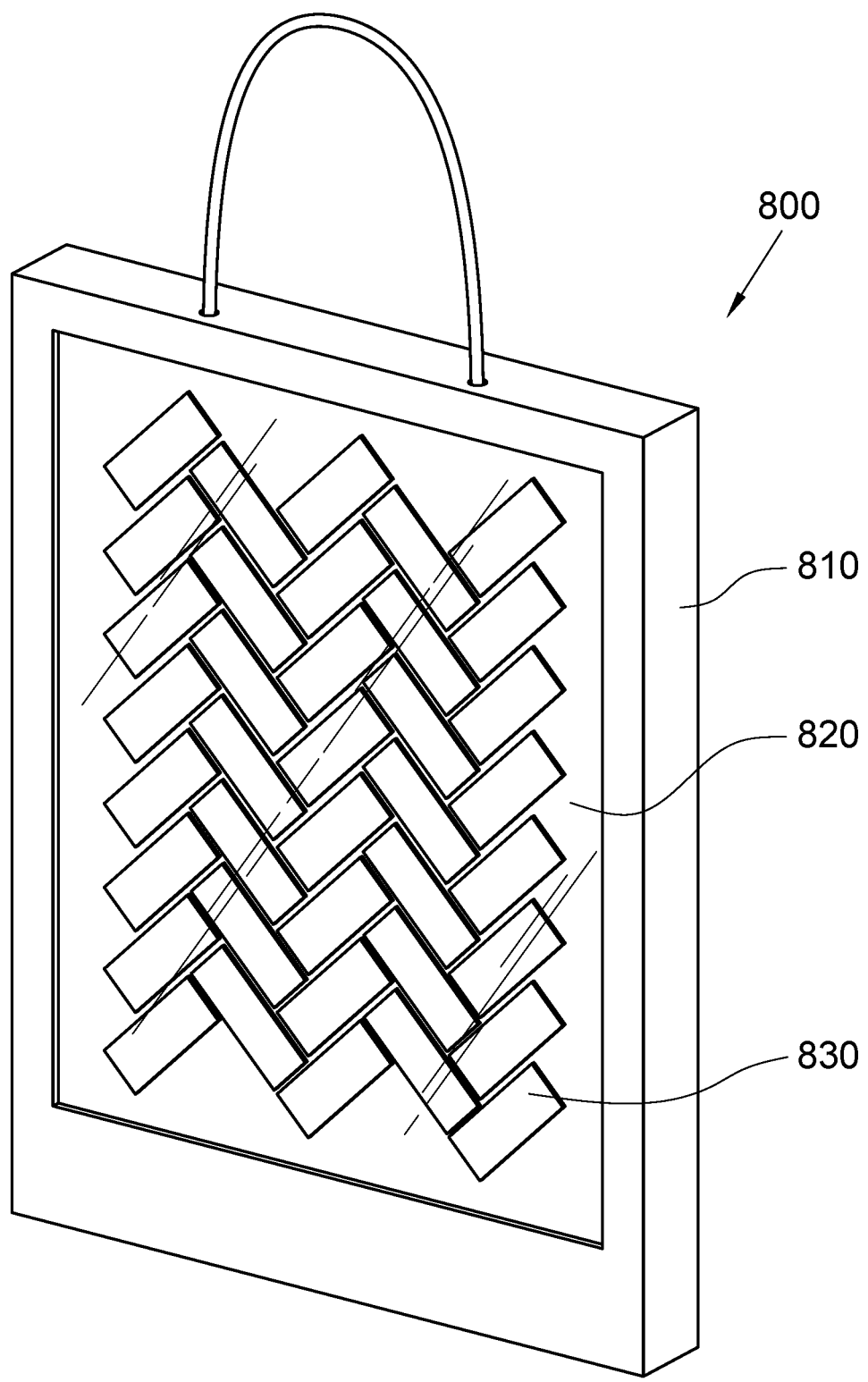
FIG. 8 is a front perspective view of a second embodiment of a solar assembly in accordance with this disclosure.
Figure 9:
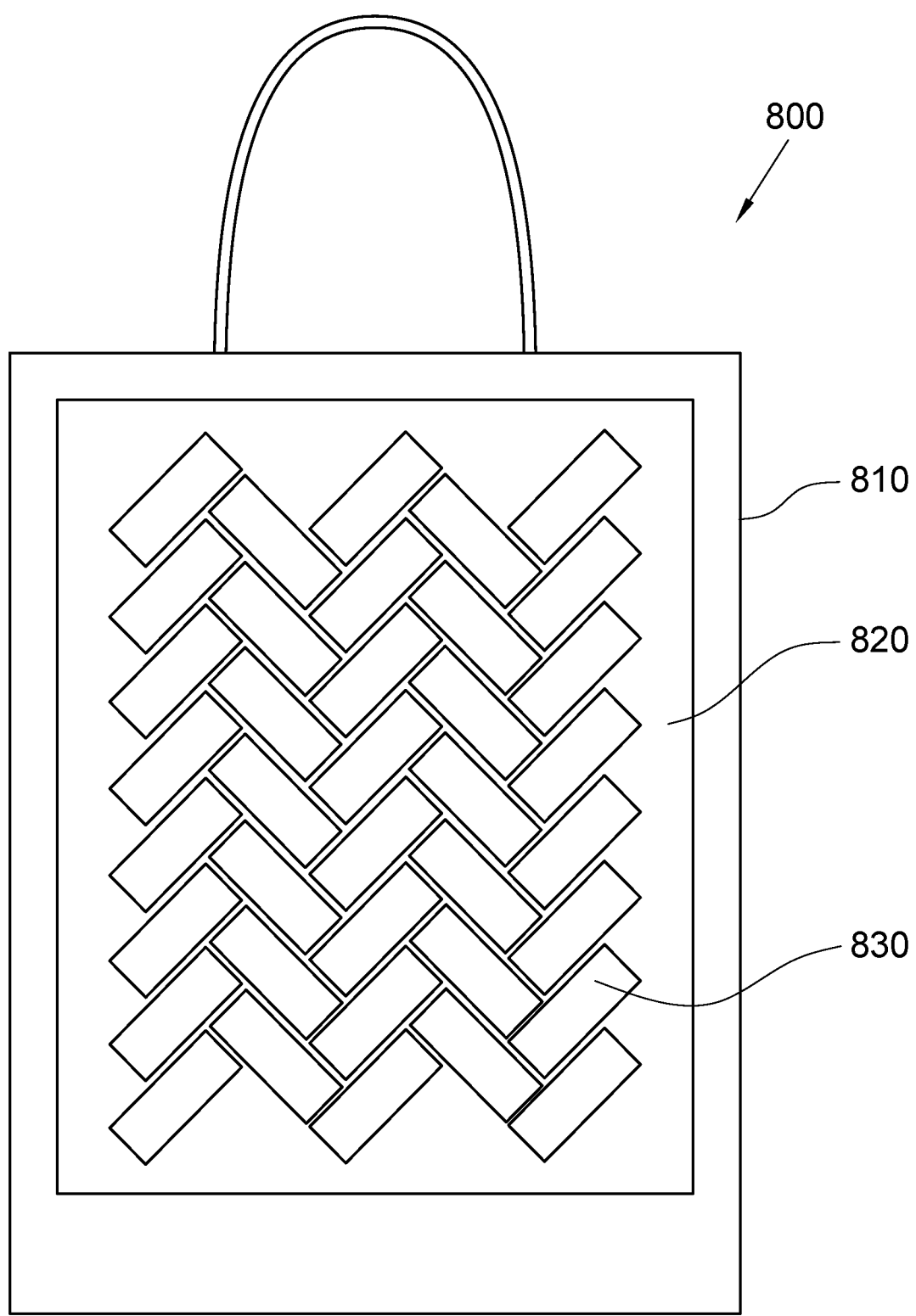
FIG. 9 is a front plan view of the solar assembly of FIG. 8.

FIG. 8 is a front perspective view of a second embodiment of a solar assembly 800 in accordance with this disclosure. FIG. 9 is a front plan view of the solar assembly 800 of FIG. 8.

As shown, the solar assembly 800 includes a frame 810, a transparent panel 820, with the frame forming a boundary about the transparent panel, and a plurality of solar cells 830 forming a pattern, in this case, a herringbone pattern.

Other elements of the second embodiment of the solar assembly 800 are similar to those discussed above with respect to the embodiment of the solar assembly 100 shown in FIG. 1.

Figure 10:
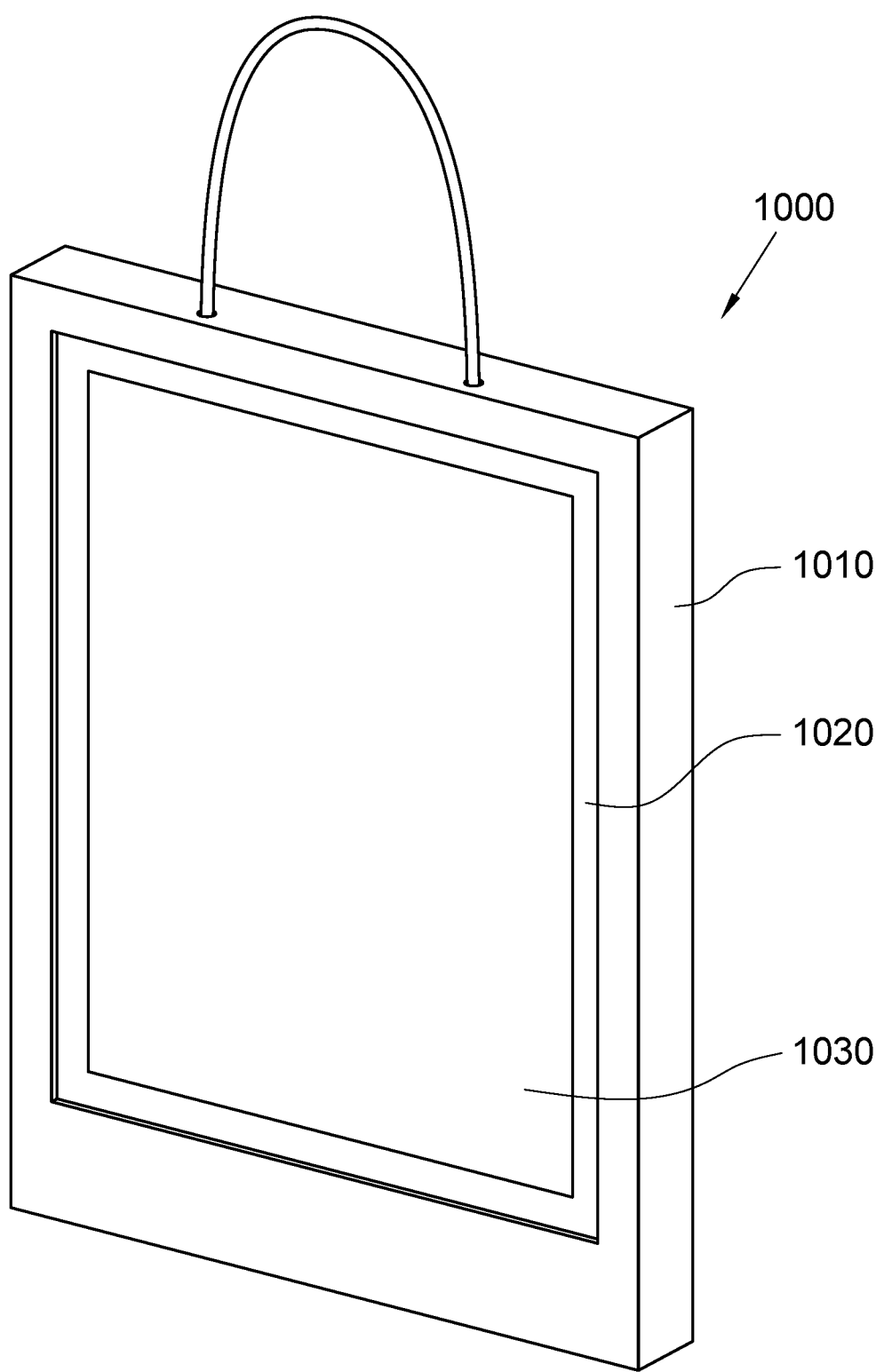
FIG. 10 is a front perspective view of a third embodiment of a solar assembly in accordance with this disclosure.

FIG. 10 is a front perspective view of a third embodiment of a solar assembly 1000 in accordance with this disclosure. As shown, the solar assembly 1000 may comprise a frame 1010, a transparent panel 1020, and a single solar cell 1030, mounted such that a portion of the transparent panel 1020 forms a boundary between the frame 1010 and the solar cell 1030.

Figure 11:
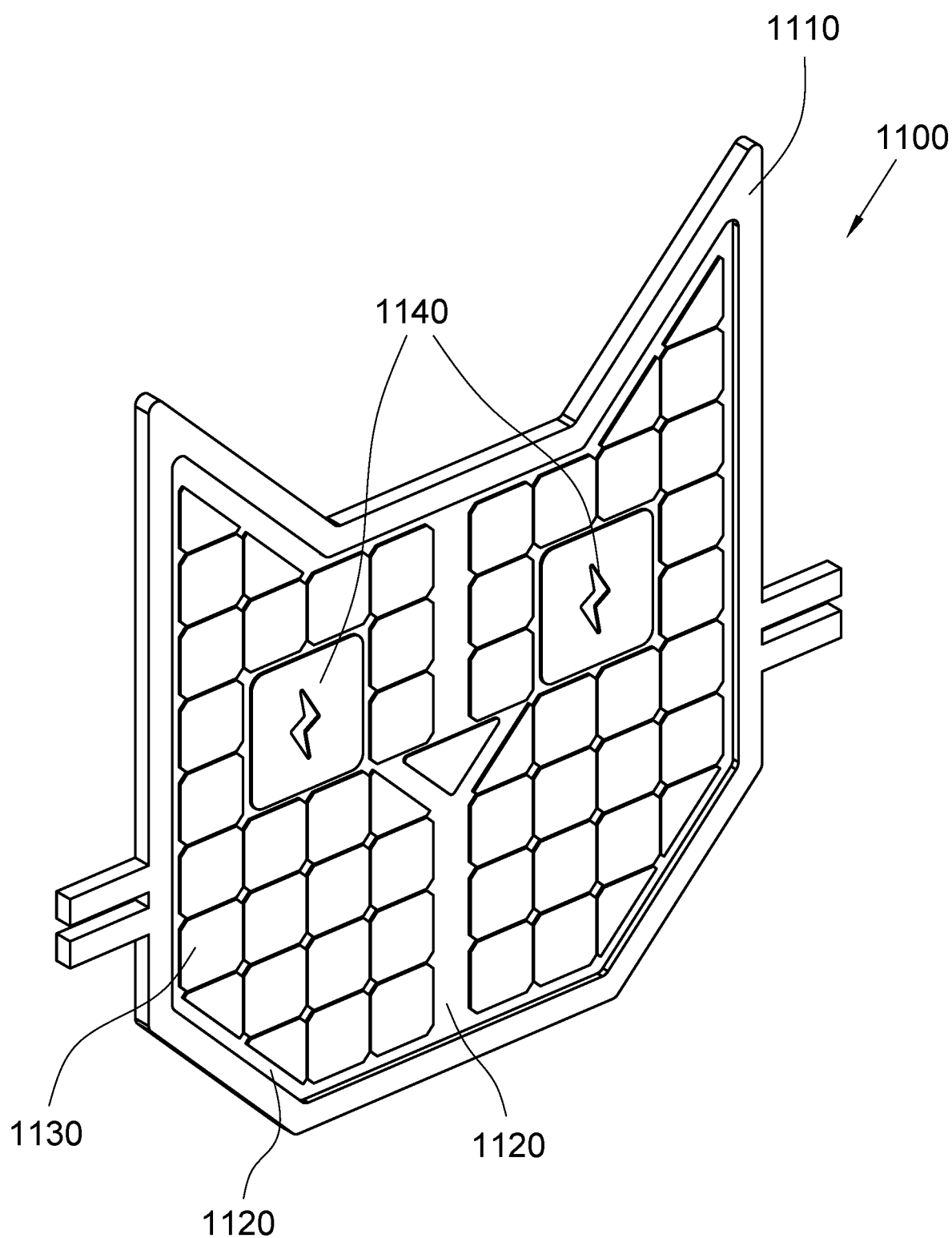
FIG. 11 is a front perspective view of a fourth embodiment of a solar assembly in accordance with this disclosure.

FIG. 11 is a front perspective view of a fourth embodiment of a solar assembly 1100 in accordance with this disclosure. As shown, the frame 1110 may be configured to form a shape other than a rectangle, in this case a cat face, and the transparent panel 1120 may be provided for mounting the solar cells 1130 in a configuration that complements the overall shape of the frame 1110. Further, specialty solar cells 1140 may be provided at specified locations in order to enhance the aesthetic effect of the frame shape 1110 and to contrast with other solar cells 1130.

FIG. 12 is a front perspective view of a fifth embodiment of a solar assembly in accordance with this disclosure. As shown, the device may be provided with a bamboo finish, and the transparent panels may comprise plastic. Further, the wire may be visible between the transparent panels.

Figure 13:
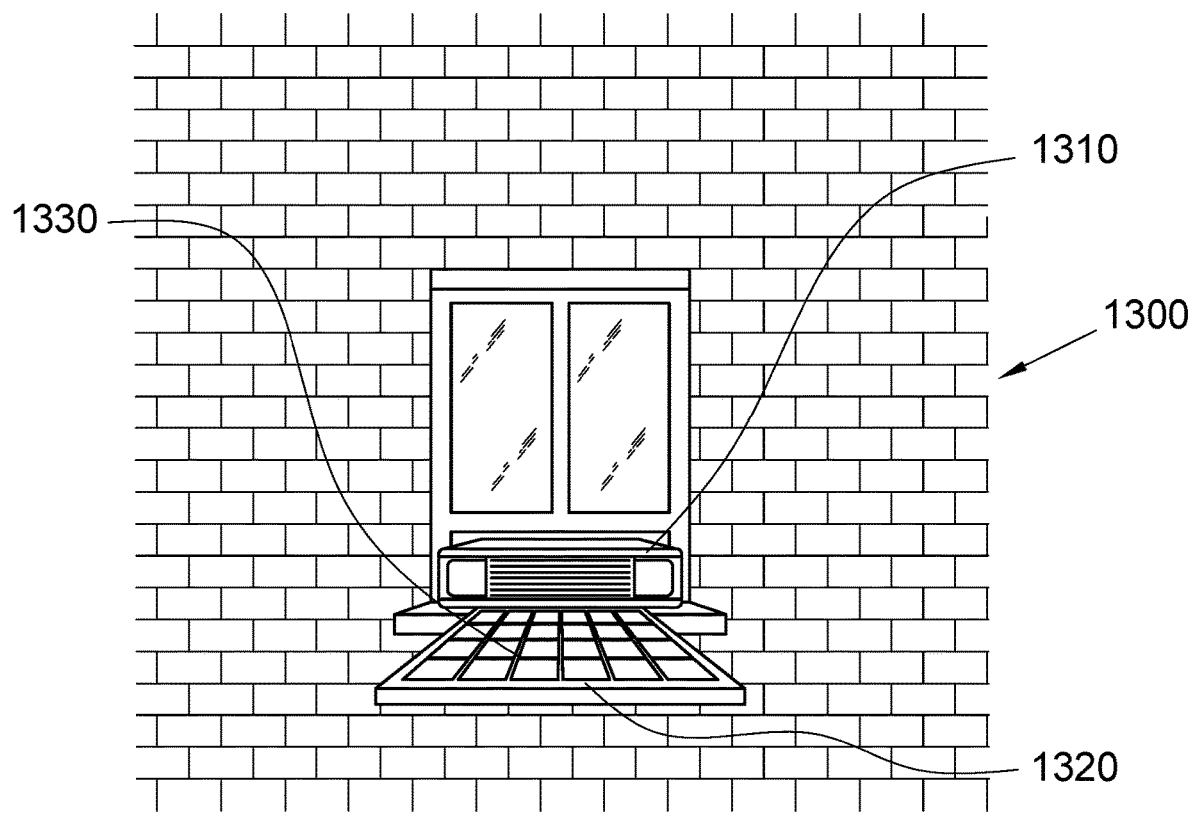
FIG. 13 is a front perspective view of a sixth embodiment of a solar assembly in accordance with this disclosure.

FIG. 13 is a front perspective view of a sixth embodiment of a solar assembly in accordance with this disclosure. As shown, the solar assembly 1300 may be incorporated into an appliance 1310, such as an air conditioner. In such an embodiment, the power storage element outputs power directly to the appliance 1310. Further, the solar assembly 1300 may provide a folding segment 1320 comprising solar cells 1330. The folding segment 1320 may be lowered when in use such that the solar cells 1330 may be better positioned to capture sunlight. When not in use, the folding segment 1320 may be raised so that the solar cells 1330 are located adjacent a window or are otherwise protected from the elements.

Figure 14:
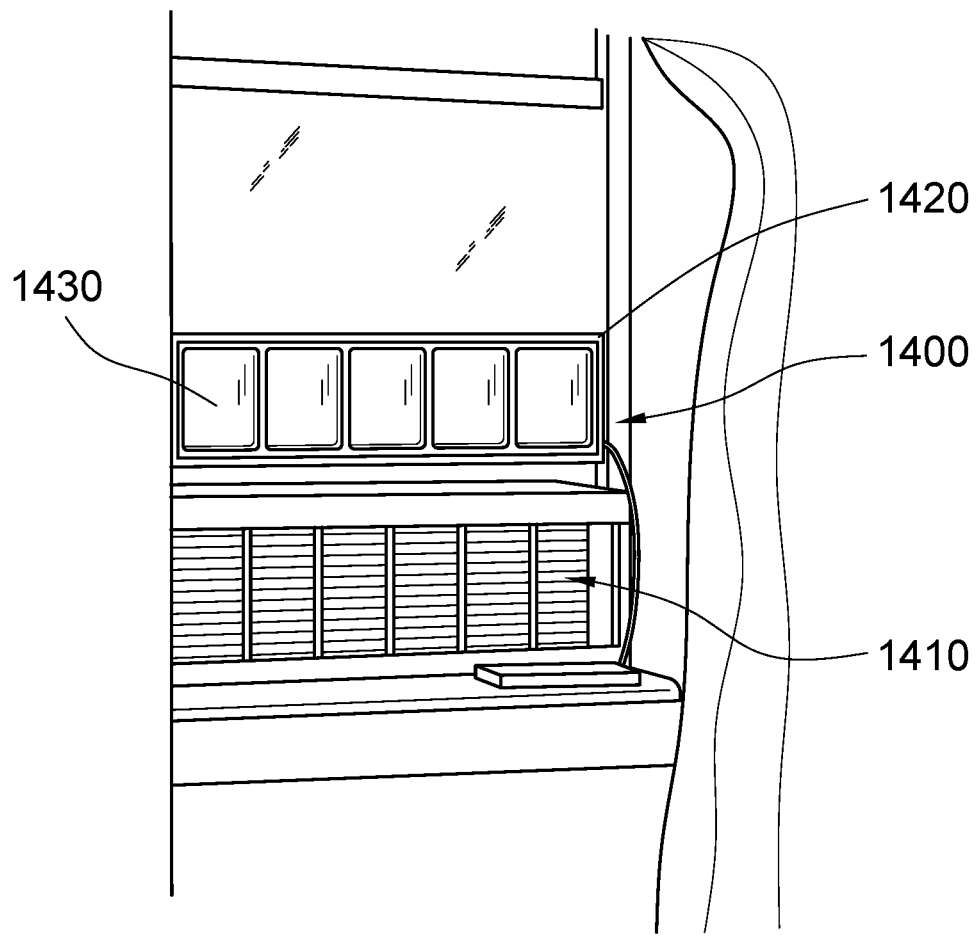
FIG. 14 is a front perspective view of a seventh embodiment of a solar assembly in accordance with this disclosure.

FIG. 14 is a front perspective view of a seventh embodiment of a solar assembly 1400 in accordance with this disclosure. As shown, the solar assembly 1400 is incorporated into an appliance, 1410, such as an air conditioner, and a frame 1420 is provided, the frame retaining the solar cells 1430.

Figure 15:
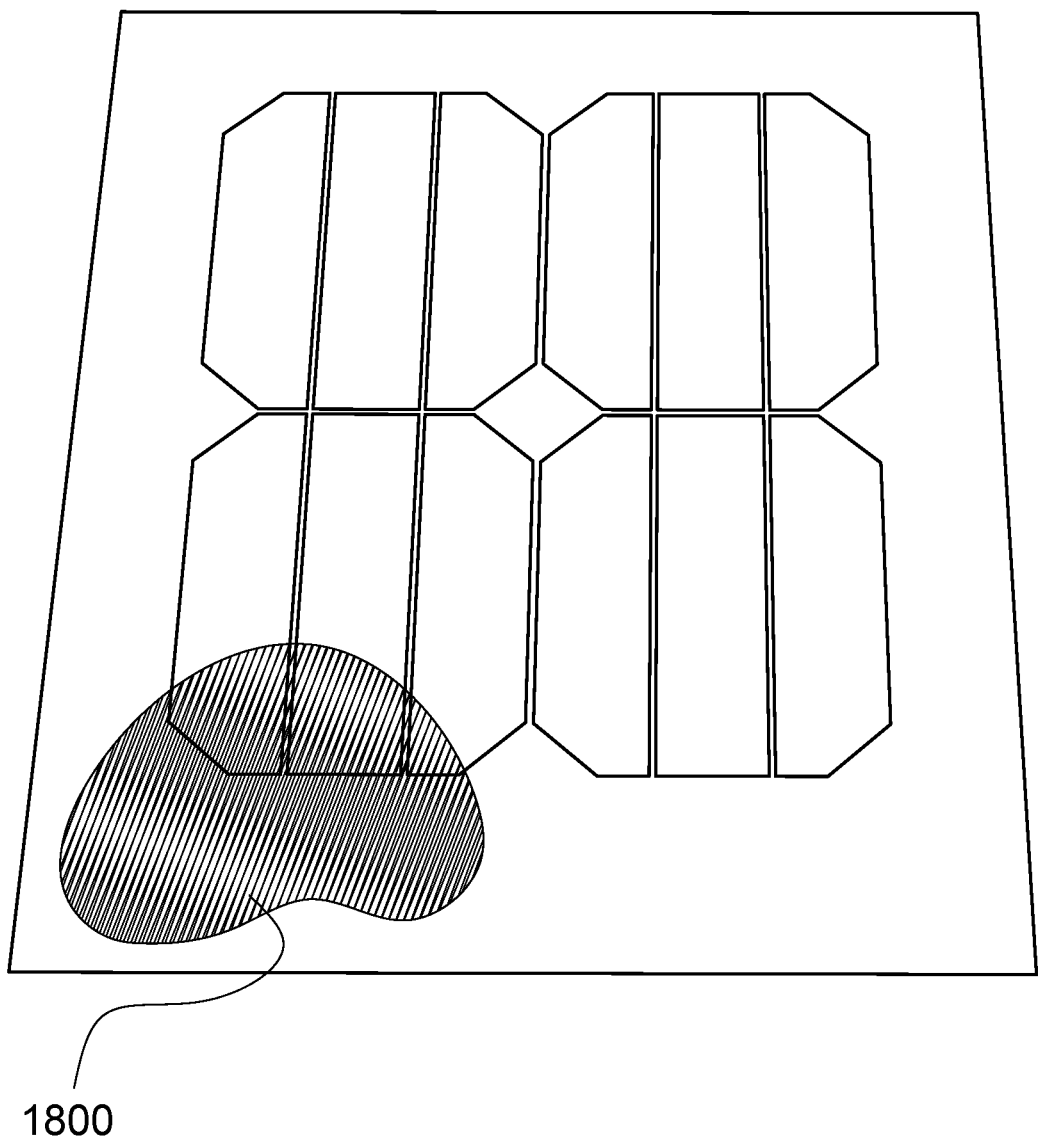
FIG. 15 is a front view of components an eight embodiment of a solar assembly in accordance with this disclosure.

FIG. 15 is a front view of components an eight embodiment of a solar assembly in accordance with this disclosure. As shown, a diffraction grating may be applied to a transparent panel used in the embodiment shown. Such a diffraction grating may generate a rainbow pattern as light passes through the assembly.

Figure 16:
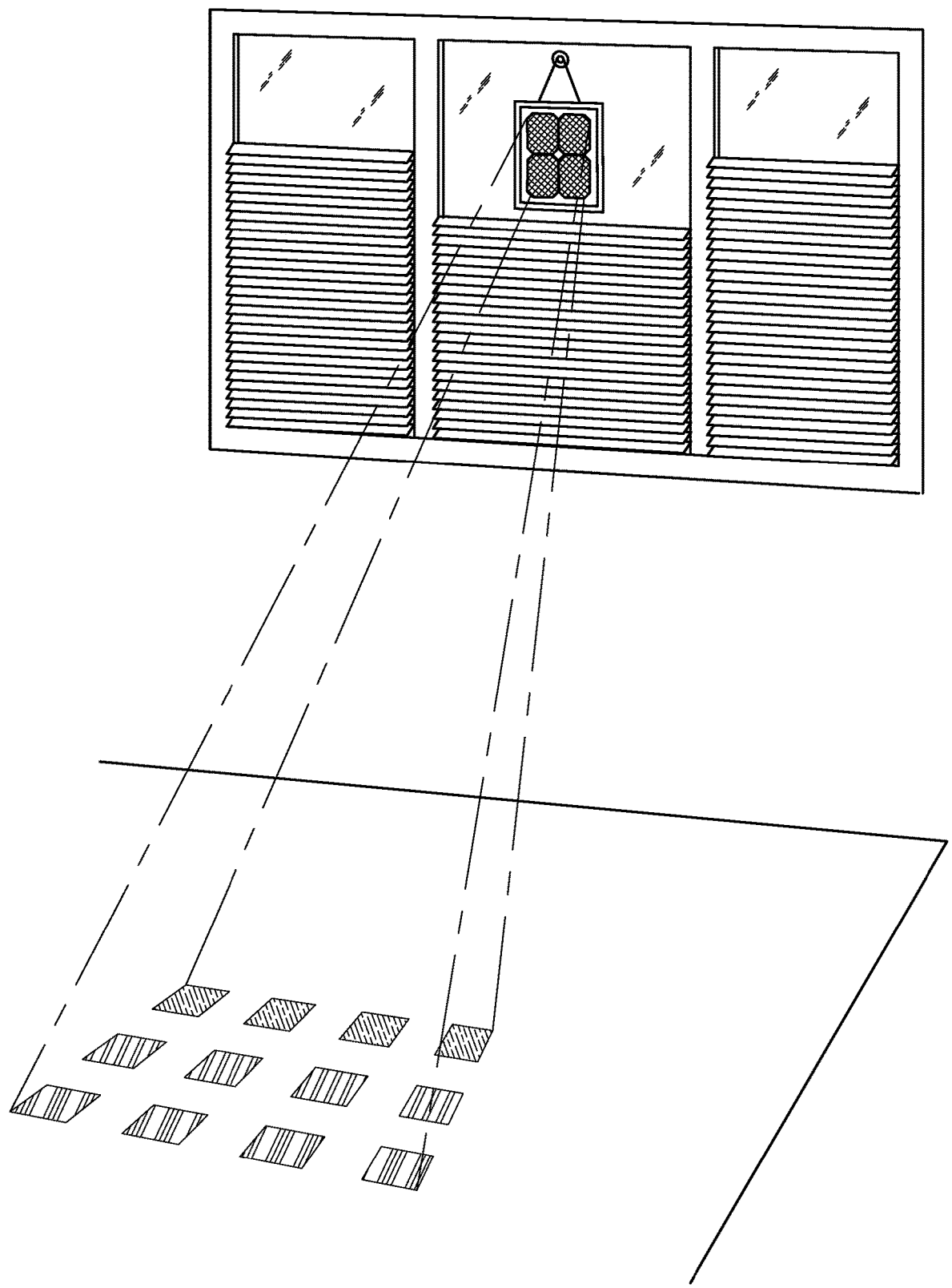
FIG. 16 is an image showing use of the eight embodiment of the solar assembly shown in FIG. 15.

FIG. 16 is an image showing use of the eight embodiment of the solar assembly shown in FIG. 15. As shown, the diffraction grating on the transparent panel of the embodiment may generate a rainbow pattern in a room where the solar assembly is mounted in a window.

Figure 17:
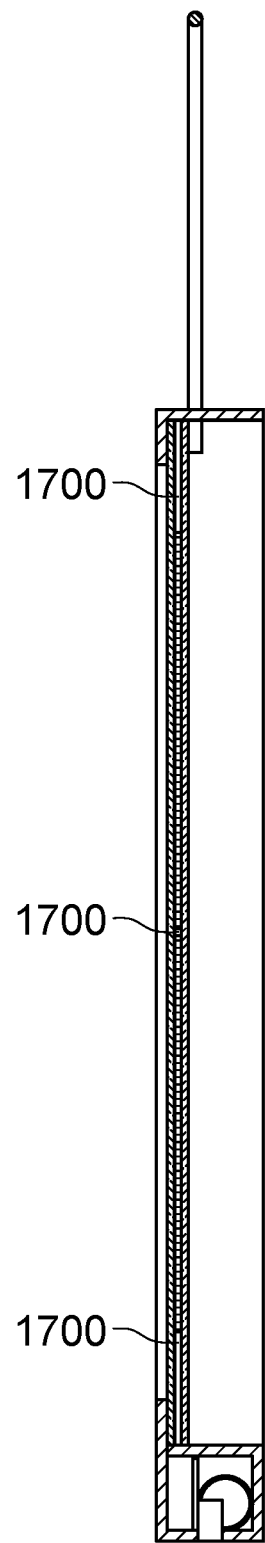
FIG. 17 is a section view of an embodiment of a solar assembly in accordance with this disclosure.

FIG. 17 is a section view of an embodiment in accordance with this disclosure. As shown, two transparent sheets sandwich solar cells. The transparent sheets are a stiff material, such as glass, such that where solar cells are not present, a gap 1700 exists between the sheets. This is in contrast with the section of the embodiment of FIG. 1, shown in FIG. 7, which includes a resin coating which effectively fills the gap between the sheets.

While the present invention has been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the invention. Furthermore, the foregoing describes the invention in terms of embodiments foreseen by the inventor for which an enabling description was available, notwithstanding that insubstantial modifications of the invention, not presently foreseen, may nonetheless represent equivalents thereto.

What is claimed is:

1. A solar assembly comprising:
   a frame;
   a first transparent panel mounted within the frame, the frame forming a boundary about the first transparent panel;
   at least one solar cell mounted on the transparent panel, such that a portion of the first transparent panel forms a boundary between the frame and the at least one solar cell;
   a second transparent panel mounted within the frame, the first transparent panel and the second transparent panel sandwiching the at least one solar cell;
   a power storage element located within a cavity in the frame;
   a wire for transporting power generated from the at least one solar cell to the power storage element; and
   a pocket on the second transparent panel for inserting a photograph,
   wherein the at least one solar cell is spaced apart from the frame on all sides such that the first transparent panel and the second transparent panel define a transparent boundary between the at least one solar cell and the frame, and such that the at least one solar panel appears suspended within the frame by the first transparent pane and the second transparent panel.

2. The solar assembly of claim 1 further comprising a power port in the frame for accessing power stored in the power storage element.

3. The solar assembly of claim 2 further comprising a circuit board for managing the charging of the power storage element and for managing power output at the power port.

4. The solar assembly of claim 2, wherein the power port comprises a USB port.

5. The solar assembly of claim 2, wherein the power port comprises a power cable for charging a user device, the solar assembly further comprising a retractor for retracting the power cable into the cavity.

6. The solar assembly of claim 1, wherein the wire is is not visible when the solar assembly is viewed from outside the transparent panel.

7. The solar assembly of claim 6, wherein the wire has a clear insulation coating.

8. The solar assembly of claim 1, wherein the first transparent panel and the second transparent panel are glass.

9. The solar assembly of claim 1, wherein the at least one solar cell is a plurality of solar cells mounted on the first transparent panel so as to form a pattern.

10. The solar assembly of claim 1 further comprising an appliance to be powered by the solar assembly, wherein the power storage element outputs power to the appliance.

11. The solar assembly of claim 10, wherein the appliance is an air conditioner.

12. A solar assembly comprising:
    a frame;
    a first transparent panel mounted within the frame, the frame forming a boundary about the first transparent panel;
    at least one solar cell mounted on the transparent panel, such that a portion of the first transparent panel forms a boundary between the frame and the at least one solar cell;
    a second transparent panel mounted within the frame, the first transparent panel and the second transparent panel sandwiching the at least one solar cell; and
    a power storage element located within a cavity in the frame,
    wherein the at least one solar cell is spaced apart from the frame on all sides such that the first transparent panel and the second transparent panel define a transparent boundary between the at least one solar cell and the frame, and
    wherein the first transparent panel further comprises a diffraction grating applied to a portion of the first transparent panel defining the transparent boundary, the diffraction grating generating a rainbow pattern as light passes through the assembly, such that a rainbow pattern forms in a room where the solar assembly is mounted in a window.

* * * * *